(12) United States Patent
Tsai et al.

(10) Patent No.: US 10,297,551 B2
(45) Date of Patent: May 21, 2019

(54) METHOD OF MANUFACTURING REDISTRIBUTION CIRCUIT STRUCTURE AND METHOD OF MANUFACTURING INTEGRATED FAN-OUT PACKAGE

(71) Applicant: Taiwan Semiconductor Manufacturing Co., Ltd., Hsinchu (TW)

(72) Inventors: Hui-Jung Tsai, Hsinchu (TW); Hung-Jui Kuo, Hsinchu (TW); Yun-Chen Hsieh, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/235,109

(22) Filed: Aug. 12, 2016

(65) Prior Publication Data

US 2018/0047674 A1     Feb. 15, 2018

(51) Int. Cl.
*H01L 23/538*     (2006.01)
*H01L 21/48*     (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/49811* (2013.01); *H01L 23/5383* (2013.01); *H01L 23/5384* (2013.01); *H01L 23/5386* (2013.01); *H01L 24/19* (2013.01); *H01L 24/97* (2013.01); *H01L 25/105* (2013.01); *H01L 25/50* (2013.01); *H01L 21/561* (2013.01); *H01L 21/568* (2013.01); *H01L 23/3128* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01);
(Continued)

(58) Field of Classification Search
CPC ...................................... H01L 24/05
See application file for complete search history.

(56) References Cited

U.S. PATENT DOCUMENTS

| | | | | |
|---|---|---|---|---|
| 5,607,879 A | * | 3/1997 | Wuu | ............... H01L 21/31116 257/E21.252 |
| 6,395,642 B1 | * | 5/2002 | Liu | ......................... C25D 5/34 438/720 |

(Continued)

*Primary Examiner* — Eliseo Ramos Feliciano
*Assistant Examiner* — Christina A Sylvia
(74) *Attorney, Agent, or Firm* — JCIPRNET

(57) ABSTRACT

A method of manufacturing a redistribution circuit structure and a method of manufacturing an INFO package at least include the following steps. An inter-dielectric layer is formed over a substrate. A seed layer is formed over the inter-dielectric layer. A plurality of conductive patterns are formed over the seed layer. The seed layer and the conductive patterns include a same material. While maintain a substantially uniform pitch width in the conductive pattern, the seed layer exposed by the conductive patterns is selectively removed through a dry etch process to form a plurality of seed layer patterns. The conductive patterns and the seed layer patterns form a plurality of redistribution conductive patterns.

20 Claims, 13 Drawing Sheets

(51) Int. Cl.
   *H01L 21/56* (2006.01)
   *H01L 23/31* (2006.01)
   *H01L 25/10* (2006.01)
   *H01L 23/498* (2006.01)
   *H01L 23/00* (2006.01)
   *H01L 25/00* (2006.01)

(52) U.S. Cl.
   CPC ........... *H01L 2224/48227* (2013.01); *H01L 2224/73265* (2013.01); *H01L 2224/73267* (2013.01); *H01L 2224/94* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | |
|---|---|---|
| 7,964,965 B2 * | 6/2011 | Lee .................. H01L 21/312 257/751 |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2012/0009777 A1 * | 1/2012 | Liu .................. H01L 24/03 438/614 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 * | 9/2014 | Hung .................. H01L 23/481 257/774 |
| 2014/0264930 A1 | 9/2014 | Yu et al. |
| 2014/0374907 A1 * | 12/2014 | Yu .................. H01L 21/76879 257/751 |

* cited by examiner

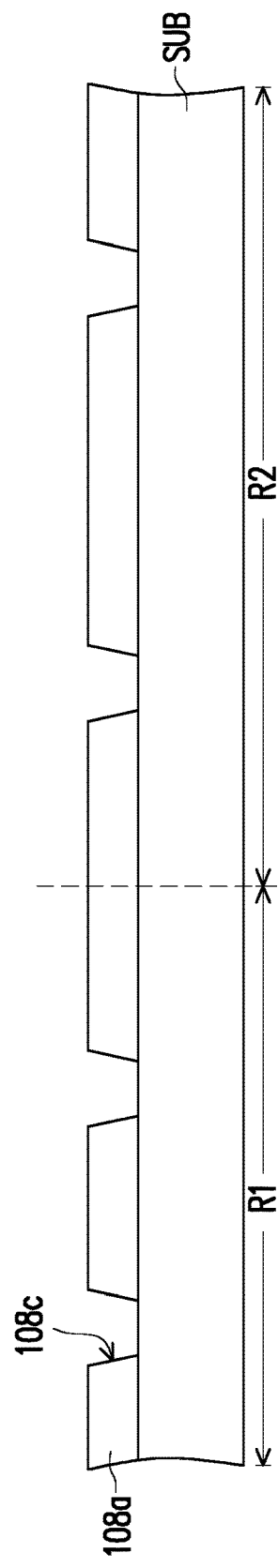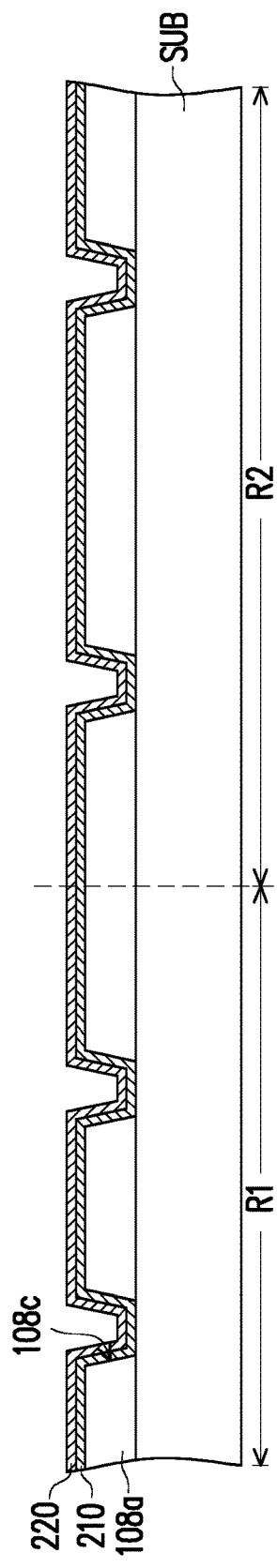

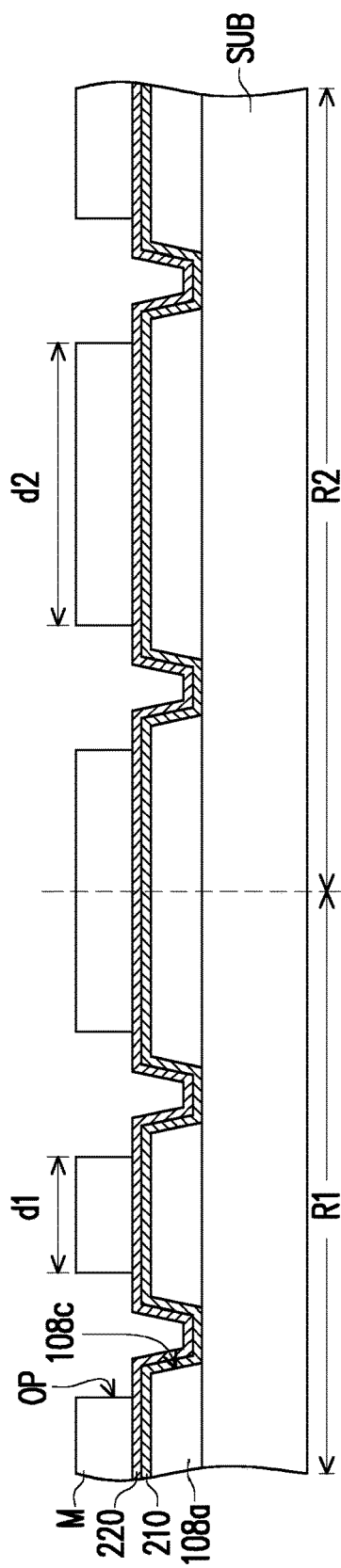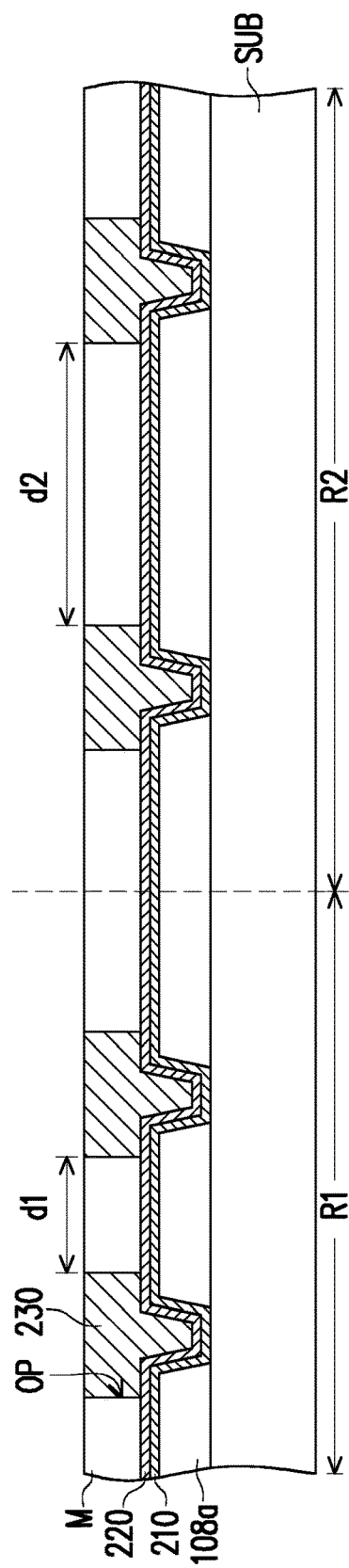

METHOD OF MANUFACTURING REDISTRIBUTION CIRCUIT STRUCTURE AND METHOD OF MANUFACTURING INTEGRATED FAN-OUT PACKAGE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. The integrated fan-out packages typically include a redistribution circuit structure laying over the molded integrated circuit devices such that the integrated circuit devices may be accessed. In order to meet the requirements for smaller sizes and higher packing densities, the manufacturing method for the redistribution circuit structure has become an important issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H are cross-sectional views illustrating a manufacturing process of the redistribution circuit structure depicted in FIG. 1D, in accordance with some embodiments of the disclosure.

DETAILED DESCRIPTION

Figure 1A:
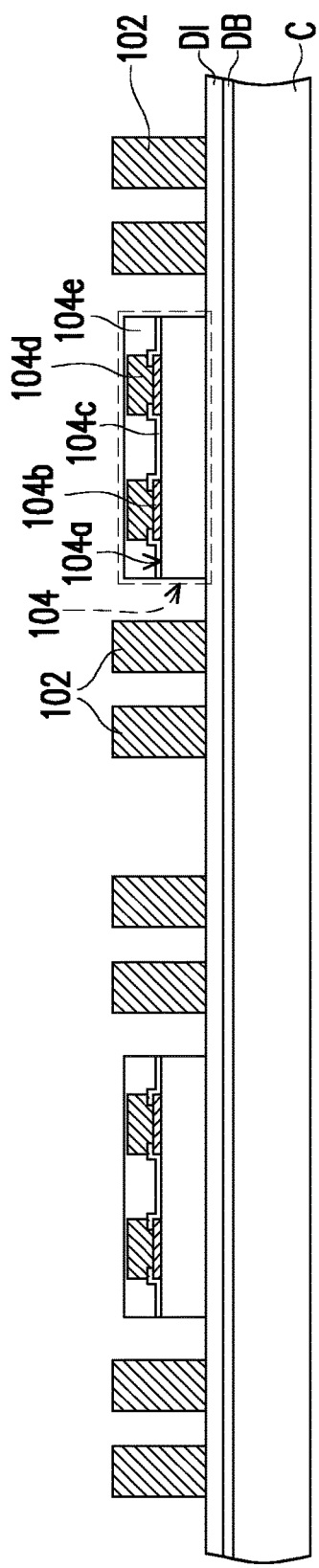
FIGS. 1A-1G are schematic cross-sectional views illustrating a manufacturing process of an integrated fan-out (INFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1G are schematic cross-sectional views illustrating a manufacturing process of an integrated fan-out (INFO) package in accordance with some embodiments of the disclosure. Referring to FIG. 1A, a carrier C is provided. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of pre-fabricated conductive posts 102 and a plurality of pre-fabricated integrated circuits 104 are provided over the dielectric layer DI. The integrated circuits 104 are mounted onto the dielectric layer DI having the conductive posts 102 formed thereon. A die attach film (DAF) (not illustrated) is locate between the integrated circuits 104 and the dielectric layer DI for adhering the integrated circuits 104 onto the dielectric layer DI. The integrated circuits 104 are arranged in an array and are surrounded by the conductive posts 102. The integrated circuits 104 are, for example, semiconductor dies. Each of the integrated circuits 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials. As illustrated in FIG. 1A, the top surfaces of the integrated circuits 104 are lower than the top surfaces of the conductive posts 102. However, the disclosure is not limited thereto. In some alternative embodiments, the top surfaces of the integrated circuits 104 may be substantially coplanar with the top surfaces of the conductive posts 102.

Figure 1B:
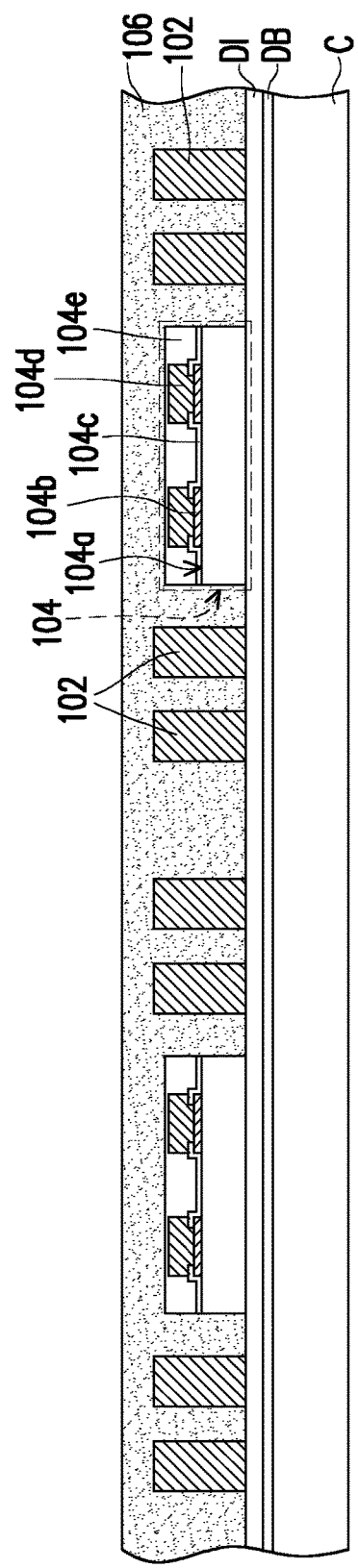

Referring to FIG. 1B, an insulating material 106 is formed on the dielectric layer DI to encapsulate the conductive posts 102 and the integrated circuits 104. In some embodiments, the insulating material 106 is a molding compound formed by a molding process. The conductive posts 102 and the protection layer 104e of the integrated circuits 104 are encapsulated by the insulating material 106. In other words, the conductive posts 102 and the protection layer 104e of the integrated circuits 104 are not revealed and are well protected by the insulating material 106. In some embodiments, the insulating material 106 may include epoxy or other suitable materials.

Figure 1C:
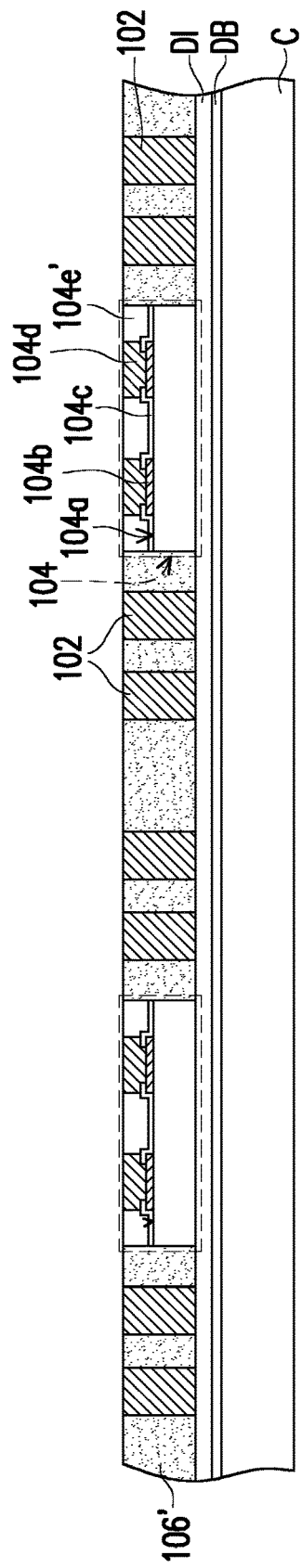

Referring to FIG. 1C, the insulating material 106 and the protection layer 104e of the integrated circuit 104 are grinded until the top surfaces of the conductive pillars 104d are exposed. After the insulating material 106 is grinded, an insulating encapsulation 106' is formed over the dielectric layer DI. During the aforementioned grinding process, portions of the protection layer 104e are also grinded to form a protection layer 104e'. In some embodiments, during the aforementioned grinding process of the insulating material 106 and the protection layer 104e, portions of the conductive pillars 104d and portions of the conductive posts 102 are grinded until the top surfaces of the conductive pillars 104d and the top surfaces of the conductive posts 102 are exposed. In other words, the insulating encapsulation 106' exposes at least part of the integrated circuits 104 and at least part of the conductive posts 102. In some embodiments, the insulating encapsulation 106' may be formed by a mechanical grinding, a chemical mechanical polishing (CMP), or another suitable mechanism.

The insulating encapsulation 106' encapsulates the sidewalls of the integrated circuit 104, and the insulating encapsulation 106' is penetrated by the conductive posts 102. In other words, the integrated circuit 104 and the conductive posts 102 are embedded in the insulating encapsulation 106'. It should be noted that although the integrated circuits 104 and the conductive posts 102 are embedded in the insulating encapsulation 106', the insulating encapsulation 106' exposes top surfaces of the integrated circuits 104 and the conductive posts 102. In other words, the top surfaces of the conductive posts 102, the top surface of the protection layer 104e', and the top surfaces of the conductive pillar 104d are substantially coplanar with the top surface of the insulating encapsulation 106'.

Figure 1D:
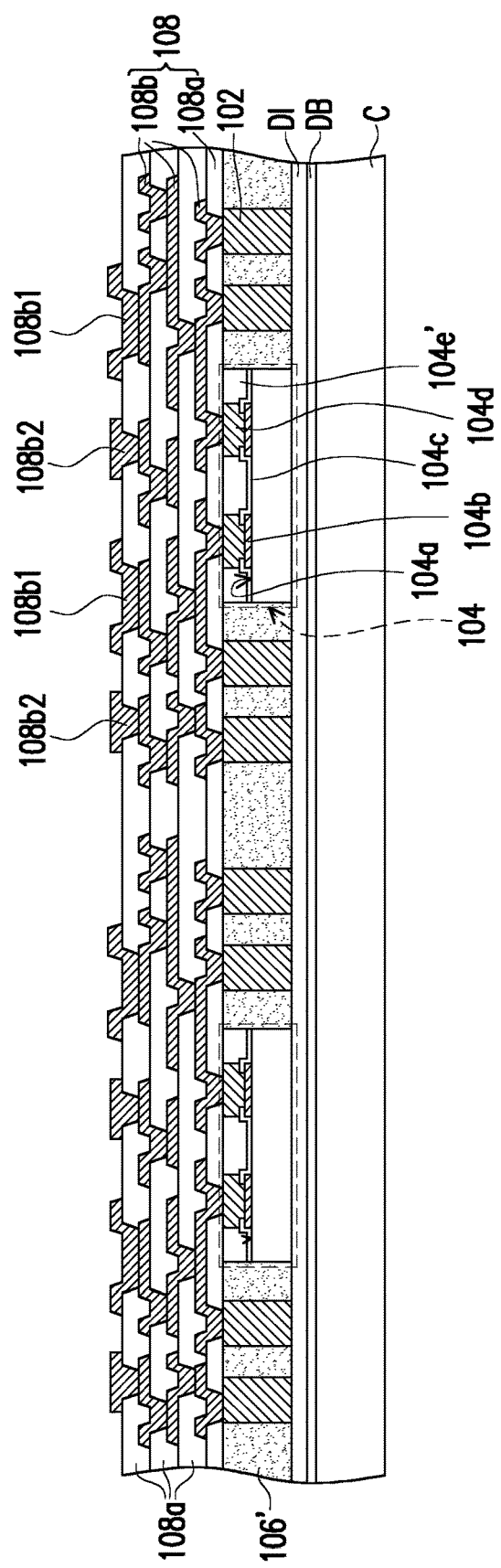
Figure 1E:
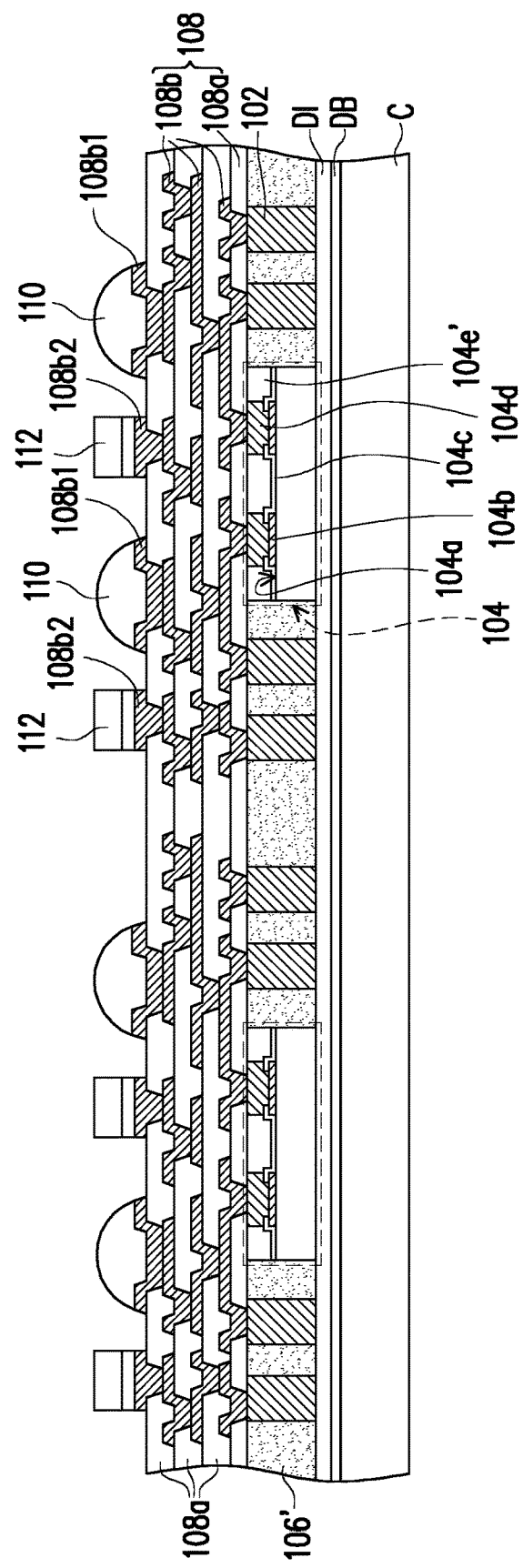

Referring to FIG. 1D, after the insulating encapsulation 106' and the protection layer 104e' are formed, a redistribution circuit structure 108 electrically connected to the conductive pillars 104d of the integrated circuit 104 and the conductive posts 102 is formed on the top surfaces of the conductive posts 102, the top surface of the insulating encapsulation 106', the top surfaces of the conductive pillars 104d, and the top surface of the protection layer 104e'. As shown in FIG. 1D, the redistribution circuit structure 108 includes a plurality of inter-dielectric layers 108a and a plurality of redistribution conductive patterns 108b stacked alternately. The redistribution conductive patterns 108b are electrically connected to the conductive pillars 104d of the integrated circuits 104 and the conductive posts 102 embedded in the insulating encapsulation 106'. In some embodiments, the top surfaces of the conductive pillars 104d and the top surfaces of the conductive posts 102 are in contact with the bottommost redistribution conductive patterns 108b of the redistribution circuit structure 108. The top surfaces of the conductive pillars 104d and the top surfaces of the conductive posts 102 are partially covered by the bottommost inter-dielectric layer 108a. Furthermore, the topmost redistribution conductive patterns 108b include a plurality of pads. In some embodiment the aforementioned pads include a plurality of under-ball metallurgy (UBM) patterns 108b1 for ball mount and/or at least one connection pads 108b2 for mounting of passive components. The number of the under-ball metallurgy patterns 180b1 and the connection pad 108b2 is not limited in this disclosure.

The detailed formation method of the redistribution circuit structure 108 will be presented below. FIGS. 2A-2H are cross-sectional views illustrating a manufacturing process of the redistribution circuit structure 108 depicted in FIG. 1D, in accordance with some embodiments of the disclosure. It should be noted that the illustrations depicted in FIGS. 2A-2H merely serve as examples for demonstration. As such, scales, dimensions, and shapes illustrated in FIGS. 2A-2H may not completely reflect the redistribution circuit structure 108 illustrated in FIG. 1D. However, same elements are denoted by the same reference numeral to establish a correlation between FIGS. 2A-2H and FIG. 1D.

Referring to FIG. 2A, a substrate SUB is provided. The substrate SUB has a first region R1 and a second region R2. Subsequently, the inter-dielectric layer 108a is formed over the substrate SUB. Referring to FIG. 2A and FIG. 1D simultaneously, since the bottommost inter-dielectric layer 108a is formed over the carrier C, the de-bonding layer DB, the dielectric layer DI, the conductive posts 102, the integrated circuits 104, and the insulating encapsulation 106', these elements constitute the substrate SUB in some embodiments. However, the disclosure is not limited thereto. In some alternative embodiments, when the redistribution circuit structure 108 is formed prior to the formation of the integrated circuits 104, the substrate SUB may be a carrier. In some embodiments, a plurality of contact openings 108c are formed in the inter-dielectric layer 108a so as to render electrical connection between the substrate SUB and the subsequently formed conductive materials. For example, as illustrate in FIG. 1D, the contact openings 108c serve as electrical contact windows between the conductive posts 102, the conductive pillars 104d, and the redistribution conductive patterns 108b. However, in some alternative embodiments, the contact openings 108c is not formed at this stage. That is, in some alternative embodiments, the contact openings 108c may be formed after the formation of the redistribution conductive patterns 108b is completed.

Referring to FIG. 2B, a barrier layer 210 and a seed layer 220 are sequentially formed over the inter-dielectric layer 108a. In some embodiments, the barrier layer 210 and the seed layer 220 are conformally disposed over the inter-dielectric layer 108a. That is, the barrier layer 210 and the seed layer 220 extend into the contact openings 108c to cover a bottom surface and sidewalls of the contact openings 108c. In some alternative embodiments, as mentioned above, the contact openings 108c are not formed at this stage. Under this scenario, the barrier layer 210 and the seed layer 220 are flat layers extending over the inter-dielectric layer 108a. The barrier layer 210 may comprise, for example, titanium, titanium nitride, tantalum, tantalum nitride, other suitable materials, or combinations thereof. On the other hand, a material of the seed layer 220 may include, for example, copper, copper alloys, or other suitable choice of materials. In some embodiments, the barrier layer 210 and the seed layer 220 are formed by physical vapor deposition or other applicable methods. The barrier layer 210 may have a thickness of approximately 0.01 μm to approximately 1 μm. On the other hand, the thickness of the seed layer 220 may range between 0.01 μm to 1 μm. In some alternative embodiments, the barrier layer 210 may be omitted.

Referring to FIG. 2C, a mask M is formed over the barrier layer 210 and the seed layer 220. The mask M is patterned to render a plurality of openings OP. In some embodiments, the openings OP correspond to the contact openings 108c. In other words, the openings OP are positioned such that the vertical projections thereof onto the substrate SUB (i.e., a planar profile/footprint thereof) respectively overlap with a corresponding one of the contact openings 108c. As mentioned above, the barrier layer 210 and the seed layer 220 are disposed conformally into the contact openings 108c. Therefore, the openings OP expose at least part of the seed layer 210. Moreover, a distance d1 between two adjacent openings OP located in the first region R1 is smaller than a distance d2 between two adjacent openings OP located in the second region R2. In other words, the first region R1 defines a higher density region in which the corresponding openings OP are arranged in a dense manner, while the second region R2 defines a lower density region in which the corresponding openings OP are arranged in a sparse manner. In some embodiments, the mask M may be formed by a photo resist or a dry film.

Referring to FIG. 2D, a conductive material 230 is filled into the openings OP of the mask M. In some embodiments, the conductive material 230 may be formed by a plating process. The plating process is, for example, electro-plating, electroless-plating, immersion plating, or the like. The conductive material is, for example, copper, copper alloys, or the like. In other words, the seed layer 220 and the conductive material 230 include the same material. For example, the seed layer 220 and the conductive material 230 are made of the same material.

Figure 2E:
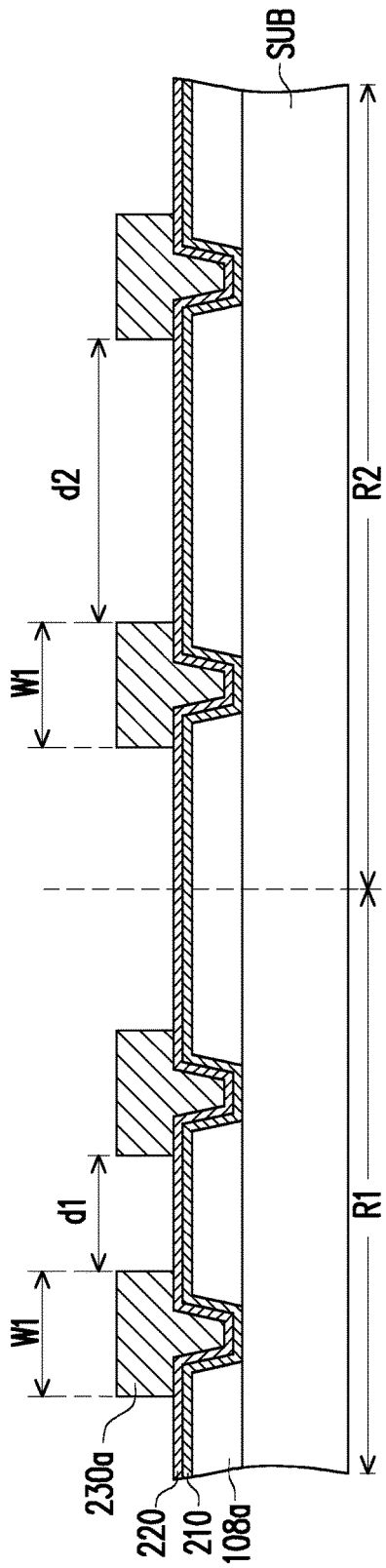

Referring to FIG. 2E, the mask M is subsequently removed to render a plurality of conductive patterns 230a. As mentioned above, the openings OP are arranged in a dense manner in the first region R1 and are arranged in a sparse manner in the second region R2. Since the conductive patterns 230a are originated from the openings OP, the conductive patterns 230a also inherent the same configuration. That is, the distance d1 between two adjacent conductive patterns 230a located in the first region R1 is smaller than the distance d2 between two adjacent conductive patterns 230a located in the second region R2. In other words, a pattern density in the first region R1 is larger than a pattern density in the second region R2. Therefore, the first region R1 may be referred as dense region and the second region R2 may be referred as sparse region. In some embodiments, each of the conductive patterns 230a has a first width w1. The first width w1 is, for example, 0.1 μm to 10 μm. In some applications, the conductive patterns 230a may define a fine pitch pattern having feature width (e.g., w1) of 0.6 μm.

Figure 2F:
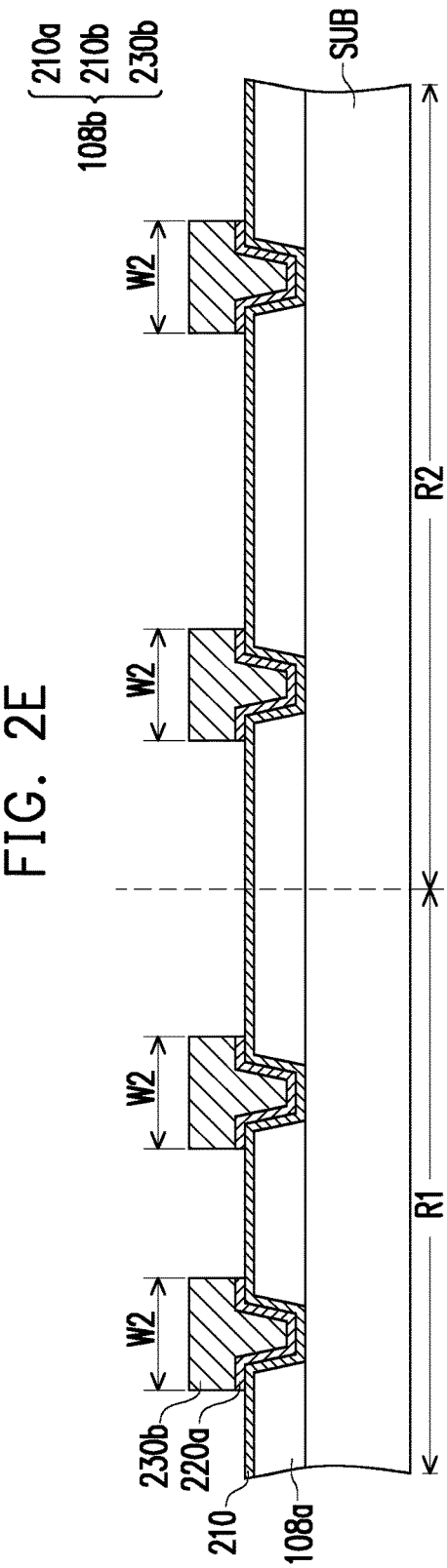

Referring to FIG. 2F, the seed layer 220 is patterned to render a plurality of seed layer patterns 220a. In detail, portions of the seed layer 220 exposed by the conductive patterns 230a are selectively removed through an anisotropic etching process. In some embodiments, the anisotropic etching process includes dry etch, and the dry etch uses an etchant including Argon (Ar) gas. Specifically, in the process of removing the seed layer 220, the etchant may include argon (Ar) gas and hydrogen (H$_2$) gas. The flow rate of the etchant may range between 10 sccm to 3000 sccm. On the other hand, during the etching process, the gas pressure range may range between 0.1 Pa to 100 Pa. Moreover, the Ar:H$_2$ ratio may range between 1:100 to 100:1. It should be noted that during the etching process, undesired byproduct may be produced. However, hydrogen gas may also serve as a cleaning gas to remove these byproducts. As such, for embodiments that employ hydrogen gas during the etching process, extra cleaning process may not be necessary.

It should be noted that, inevitably, materials of the conductive patterns 230a may be partially removed during the etching process of the seed layer 220. Specifically, a height and the width w1 of each of the conductive patterns 230a may be reduced, resulting in a plurality of remaining conductive patterns 230b. However, during the etching process, a substantially uniform pitch width in the conductive pattern 230b is maintained. In some embodiments, each of the remaining conductive patterns 230b has a post-etching width of w2. It should be noted that, by utilizing the dry etching technique in accordance with the instant disclosure, a loss of each of the conductive patterns 230a in the first region R1 may be maintained substantially equal to a loss of each of the conductive patterns 230a in the second region R2 during removal process of the seed layer 220. That is, a loss of each of the conductive patterns 230a may be kept substantially uniform in both the dense area and the sparse area. In other words, through the dry etching process in accordance with embodiments of the instant disclosure, uniformity in loss of the patterns may be obtained regardless of pattern density. As such, loading effect during etching process may be reduced or eliminated. Therefore, problems of broken traces in the sparse area may be alleviated while electrical connection in the redistribution circuit structure 108 (show in FIG. 2G) may be ensured.

As mentioned above, during the etching process of the seed layer 220, the width w1 of each of the conductive patterns 230a is inevitably reduced. In some embodiments, the loss may be 0 μm to 0.05 μm per side. In other words, a difference between the first width w1 of the conductive patterns 230a and the second width w2 of the conductive patterns 230b may be kept within 0.1 μm. For many practical applications, such loss is neglectable. It should be noted that as compared to a widely-adopted wet etching process, the loss in the conductive patterns 230a during the dry etching process of the present disclosure is significantly less. Accordingly, the width w2 of the redistribution conductive patterns 108b may be effectively controlled, thereby ensuring the yield and the quality of the redistribution circuit structure 108 (show in FIG. 2G) having fine pitch traces. In some embodiments, the width w1 of the conductive patterns 230a in the first region R1 and the width w1 of the conductive patterns 230a in the second region R2 are the same and merely for illustration and the disclosure is not limited thereto. In other words, the width of the conductive patterns 230a in the first region R1 and the width of the conductive patterns 230a in the second region R2 may be different, and a loss of the conductive patterns 230a in the first region R1 and that in the second region R2 caused by the patterning of the seed layer 220 are substantially the same.

Figure 2G:
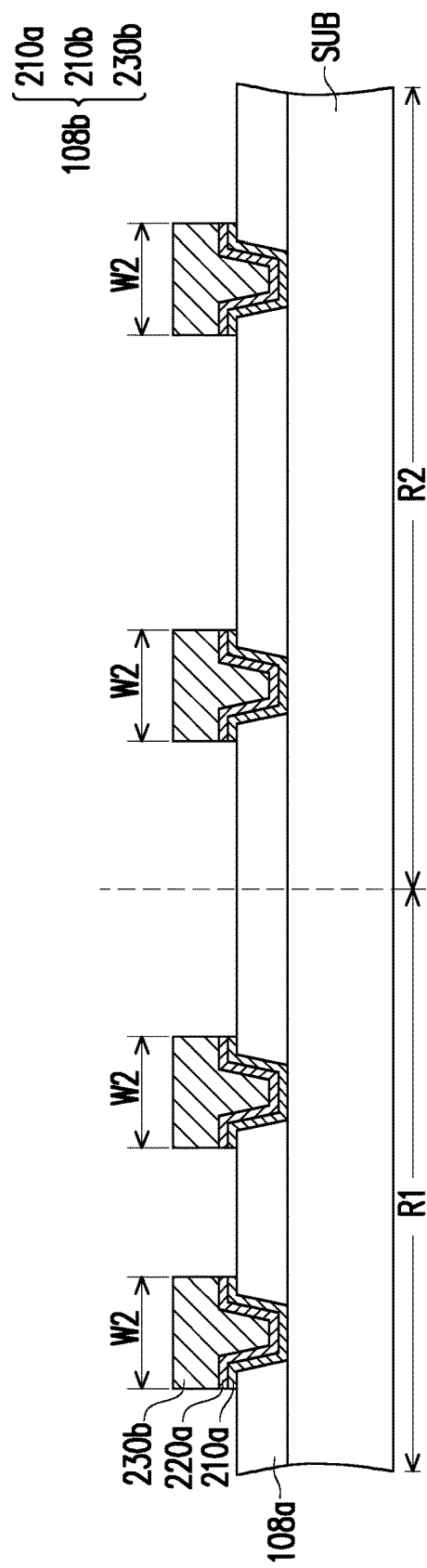

As illustrated in FIG. 2F, after the removal of the portions of the seed layer 220, portions of the barrier layer 210 is exposed by the remaining conductive patterns 230b and the seed layer patterns 220a. Referring to FIG. 2G, the portions of the barrier layer 210 exposed may be removed through dry etch. The etchant for removing the barrier layer 210 may include fluorine-based gases such as tetrafluoromethane (CF$_4$) gas, fluoroform (CHF$_3$) gas, other suitable gases, or a combination thereof. The reaction may be expressed as:

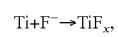

wherein x is an integer equal to 1, 2, etc. The resulting gas TiF$_x$ is removed from the reaction chamber. When barrier layer 210 has a thickness of approximately 0.1 the dry etching process may take a couple of minutes.

As illustrated in FIG. 2G, the sidewalls of the remaining conductive patterns 230b are substantially flush with that of the seed layer patterns 220a and the barrier layer patterns 210a. Through the foregoing process (the dry etch), the sidewalls of the remaining conductive patterns 230b are substantially aligned with sidewalls of the seed layer patterns 220a and sidewalls of the barrier layer patterns 210a. Since the top layer is substantially aligned with the bottom layers, Compared with the etch profile of currently-adopted wet etching process in which severe over-etch in the barrier layer and/or seed layer frequently occurs (which leads to the generation of undesirable undercut profile), the dry etch process in accordance with the instant disclosure effectively reduced/prevented the issue of undercut in the barrier layer patterns 210a and the seed layer patterns 220a. Thus, the bonding area between the barrier layer patterns 210a and the patterned seed layer 220a may be larger, and therefore the adhesion between these two layers may be enhanced. As such, the peeling issue of the remaining conductive patterns 230b and the patterned seed layer 220a formed over the barrier layer patterns 210a may be resolved. The remaining conductive patterns 230b, the seed layer patterns 220a, and the barrier layer patterns 210a constitute the redistribution conductive patterns 108b.

Figure 2H:
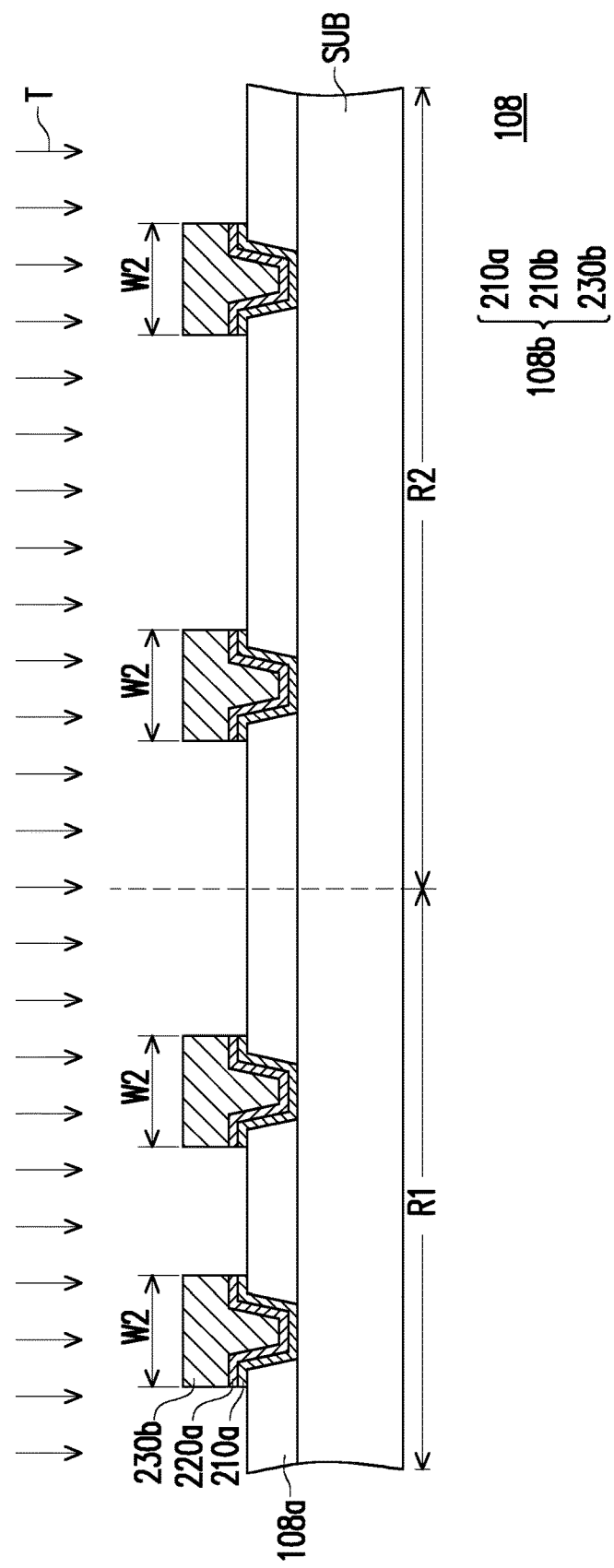

Referring to FIG. 2H, a treatment process T is performed on the redistribution conductive patterns 108b. The treatment process T is, for example, a plasma treatment process or other suitable processes. Since the barrier layer 210 and the seed layer 220 are removed through dry etch, the subsequent treatment process T may be performed in the same chamber as that of the etching process. In other words, the step of removing the seed layer 220 and the barrier layer 210 and the step of performing the treatment process T are in-situ processes. As such, the foregoing steps may be considered as one single step, and production time and cost may be reduced.

In some embodiments, the redistribution circuit structure 108 is a single-layered structure. Thus, upon performing the steps illustrated in FIGS. 2A-2H, the redistribution circuit structure 108 is substantially completed. However, in some alternative embodiments, the redistribution circuit structure 108 is a multi-layered structure (for example, the redistribution circuit structure 108 illustrated in FIG. 1D). Under this condition, the steps illustrated in FIGS. 2A-2H may be repeated several times to render the redistribution circuit structure 108.

It should be noted that the steps illustrated in FIGS. 2A-2H are not limited to fabricating the redistribution circuit structure 108 depicted in FIG. 1D. The foregoing step may be utilized in redistribution circuit structures located at other positions in a package. For example, the foregoing steps may be employed in a redistribution circuit structures within an integrated circuit. In some alternative embodiments, the foregoing step may be utilized to manufacturing an UBM and a conductive post (serving as a conductive terminal for electrical connection with other packages) formed over the UBM.

Referring back to FIG. 1E, after the redistribution circuit structure 108 is formed, a plurality of conductive terminals 110 are placed on the under-ball metallurgy patterns 108b1, and a plurality of passive components 112 are mounted on the connection pads 108b2. In some embodiments, the conductive terminals 110 may be placed on the under-ball metallurgy patterns 108b1 through a ball placement process or other suitable processes and the passive components 112 may be mounted on the connection pads 108b2 through a soldering process, a reflowing process, or other suitable processes.

Figure 1F:
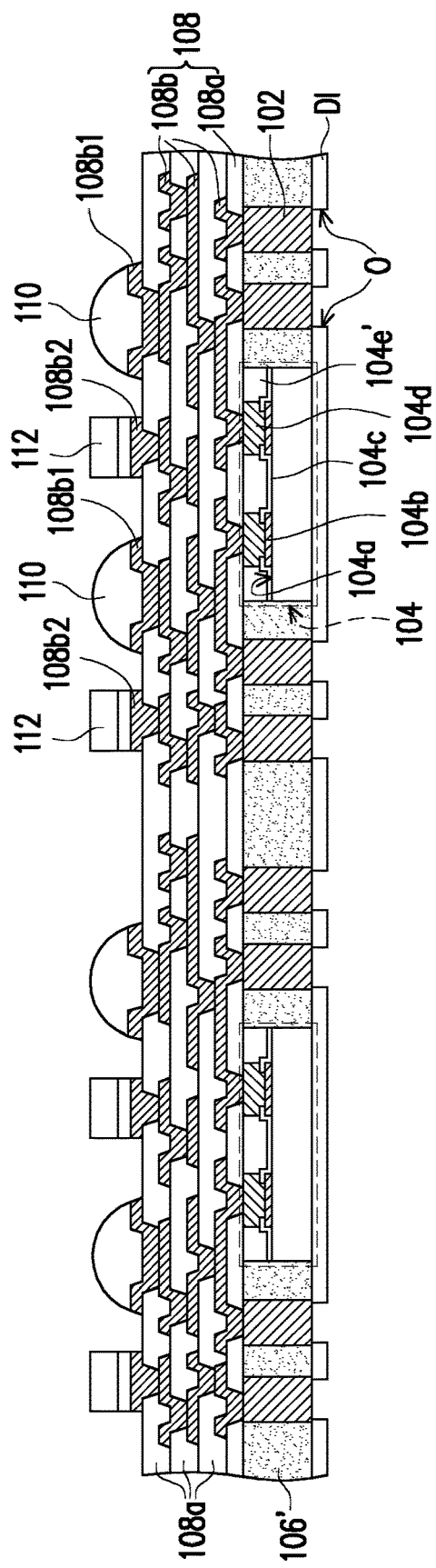

Referring to FIG. 1F, after the conductive terminals 110 and the passive components 112 are mounted on the redistribution circuit structure 108, the dielectric layer DI formed on the bottom surface of the insulating encapsulation 106' is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the insulating encapsulation 106' is peeled from the carrier C. As illustrated in FIG. 1F, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

Figure 1G:
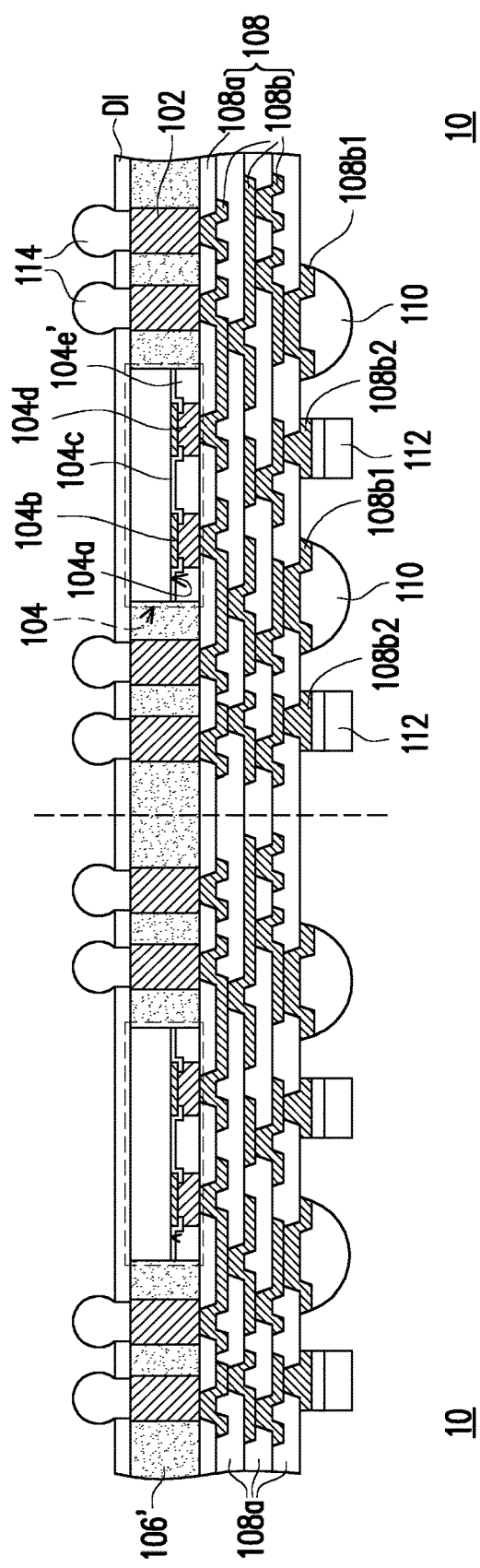

Referring to FIG. 1G, after the contact openings O are formed in the dielectric layer DI, a plurality of conductive terminals 114 are placed in the contact openings O, and the conductive terminals 114 are electrically connected to the conductive posts 102. Herein, formation of an integrated fan-out (INFO) package array is substantially completed. As illustrated in FIG. 1G, after the conductive terminals 110 and the conductive terminals 114 are formed, the INFO package array is diced to form a plurality of INFO packages 10 having dual-side terminal design. In some embodiment, the dicing process or singulation process typically involves dicing with a rotating blade or a laser beam. In other words, the dicing or singulation process is, for example, a laser cutting process, a mechanical cutting process, or other suitable processes.

Figure 1H:
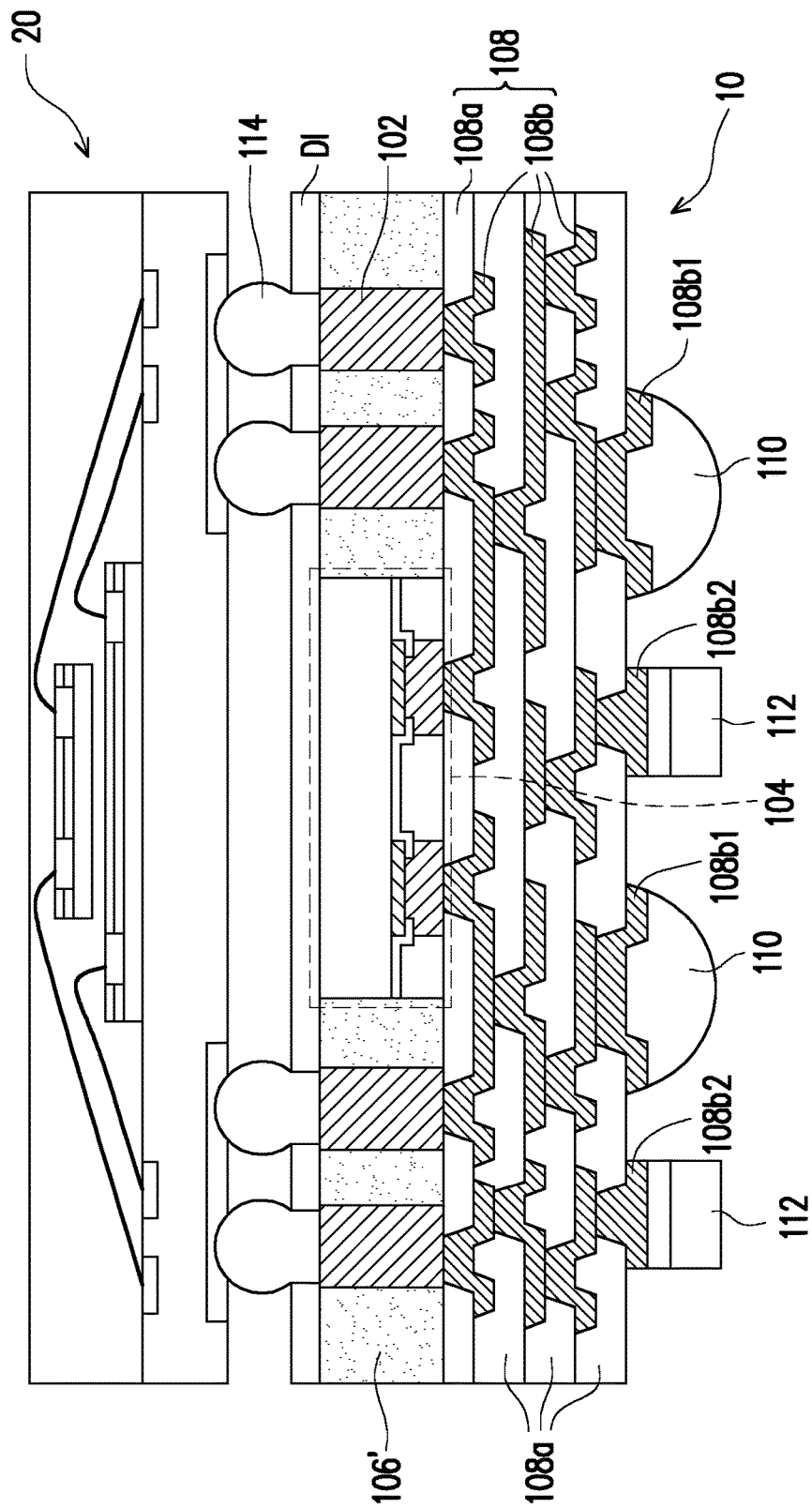
FIG. 1H is a cross-sectional view illustrating a package-on-package (POP) structure in accordance with some embodiments of the disclosure.

FIG. 1H is a cross-sectional view illustrating a package-on-package (POP) structure in accordance with some embodiments of the disclosure. In some embodiments, the INFO package 10 may be stack with other electronic devices. For example, referring to FIG. 1H, another package 20 is provided. The package 20 is, for example, an IC package. The package 20 is stacked over and electrically connected to the INFO package 10 through the conductive terminals 114 such that the package-on-package (POP) structure is fabricated. It should be noted that FIG. 1H merely serves as an exemplary illustration, and the disclosure is not limited thereto. In some alternative embodiments, the INFO package 10 may be stacked with other electronic devices such as another INFO package, a memory device, a ball grid array (BGA), or a wafer. Furthermore, the stacking may be performed preceding the dicing process. For example, the INFO package array illustrated in FIG. 1G may be stacked with a wafer, and the singulation process may be performed on the stacked INFO package array and the wafer simultaneously.

In accordance with some embodiments of the present disclosure, a method of manufacturing a redistribution circuit structure includes at least the following steps. An inter-dielectric layer is formed over a substrate. A seed layer is formed over the inter-dielectric layer. A plurality of conductive patterns are formed over the seed layer. The seed layer and the conductive patterns include a same material. While maintaining a substantially uniform pitch width in the conductive pattern, the seed layer exposed by the conductive patterns is selectively removed through a dry etch process to form a plurality of seed layer patterns. The conductive patterns and the seed layer patterns form a plurality of redistribution conductive patterns.

In accordance with some embodiments of the present disclosure, a method of manufacturing a redistribution circuit structure includes at least the following steps. An inter-dielectric layer is formed over a substrate. The substrate has a first region and a second region. A seed layer is formed over the inter-dielectric layer. A plurality of conductive patterns are formed over the seed layer. The seed layer and the conductive patterns include a same material. A pattern density of the conductive patterns in the first region is larger than that in the second region. Through dry etch, the seed layer exposed by the conductive patterns is removed to form a plurality of seed layer patterns. A loss of each of the conductive patterns in the first region is substantially equal to a loss of each of the conductive patterns in the second region. The conductive patterns and the seed layer patterns form a plurality of redistribution conductive patterns.

In accordance with some embodiments of the present disclosure, a method of manufacturing an integrated fan-out (INFO) package includes at least the following steps. A carrier having a plurality of integrated circuits and a plurality of conductive posts formed thereon is provided. The integrated circuits and the conductive posts are encapsulated by an insulating encapsulation. The insulating encapsulation exposes at least part of the integrated circuits and at least part of the conductive posts. A redistribution circuit structure is formed over the insulating encapsulation to electrically connect with the integrated circuits and the conductive posts. Subsequently, the carrier is removed. The redistribution circuit structure is formed by at least the following steps. An inter-dielectric layer is formed over the insulating encapsulation. A barrier layer and a seed layer are sequentially formed over the inter-dielectric layer. A mask having a plurality of openings is provided over the seed layer. The openings expose at least part of the seed layer. A conductive material is filled into the openings to form a plurality of conductive patterns. The seed layer and the conductive material include a same material. The mask is removed. The seed layer and the barrier layer exposed by the conductive patterns are removed through dry etch to form a plurality of seed layer patterns and a plurality of barrier layer patterns. The conductive patterns, the seed layer patterns, and the barrier layer patterns form a plurality of redistribution conductive patterns. A treatment process is performed on the redistribution conductive patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a redistribution circuit structure, comprising:
    forming an inter-dielectric layer over a substrate;
    forming a seed layer over the inter-dielectric layer;
    forming a plurality of conductive patterns over the seed layer, wherein the seed layer and the conductive patterns comprise a same material;
    selectively removing the seed layer exposed by the conductive patterns by performing a dry etch process to form a plurality of seed layer patterns, wherein the conductive patterns and the seed layer patterns form a plurality of redistribution conductive patterns; and
    performing a plasma treatment process on the redistribution conductive patterns, wherein the step of removing the seed layer and the step of performing the plasma treatment process are in-situ processes.

2. The method according to claim 1, further comprising forming a barrier layer between the seed layer and the inter-dielectric layer.

3. The method according to claim 2, further comprising removing the barrier layer exposed by the conductive patterns to form a plurality of barrier layer patterns, wherein the redistribution conductive patterns further comprise the barrier layer patterns.

4. The method according to claim 1, wherein the seed layer and the conductive patterns comprise copper.

5. The method according to claim 1, wherein before and after the dry etch, a width difference of each of the conductive patterns is less than 0.1 μm.

6. The method according to claim 1, wherein the etchant used in the dry etch comprises Argon (Ar) gas, Hydrogen ($H_2$) gas, or a combination thereof.

7. The method according to claim 1, wherein the etchant used in the dry etch comprises Argon.

8. The method according to claim 7, wherein the etchant further comprises Hydrogen ($H_2$) gas.

9. A method of manufacturing a redistribution circuit structure, comprising:
    forming an inter-dielectric layer over a substrate, wherein the substrate has a first region and a second region;
    forming a seed layer over the inter-dielectric layer;
    forming a plurality of conductive patterns over the seed layer, wherein the seed layer and the conductive patterns comprise a same material, and a pattern density of the conductive patterns in the first region is larger than that in the second region;
    performing a dry etch process to remove the seed layer exposed by the conductive patterns to form a plurality of seed layer patterns, wherein a loss of each of the conductive patterns in the first region is substantially equal to a loss of each of the conductive patterns in the second region, and the conductive patterns and the seed layer patterns form a plurality of redistribution conductive patterns; and
    after performing the dry etch process, performing a plasma treatment process on the redistribution conductive patterns, wherein the step of removing the seed layer and the step of performing the plasma treatment process are in-situ processes.

10. The method according to claim 9, wherein before and after the dry etch, a width difference of each of the conductive patterns is less than 0.1 μm.

11. The method according to claim 9, wherein the etchant used in the dry etch comprises Argon (Ar) gas.

12. The method according to claim 11, wherein the etchant further comprises Hydrogen ($H_2$) gas.

13. The method according to claim 9, wherein before and after the dry etch, a width difference of each of the conductive patterns is less than 0.05 μm per side.

14. A method of manufacturing an integrated fan-out (INFO) package, comprising:
    providing a carrier having a plurality of integrated circuits and a plurality of conductive posts formed thereon;

encapsulating the integrated circuits and the conductive posts with an insulating encapsulation, wherein the insulating encapsulation exposes at least part of the integrated circuits and at least part of the conductive posts;

forming a redistribution circuit structure over the insulating encapsulation to electrically connect with the integrated circuits and the conductive posts, comprising:

forming an inter-dielectric layer over the insulating encapsulation;

sequentially forming a barrier layer and a seed layer over the inter-dielectric layer;

providing a mask having a plurality of openings over the seed layer, wherein the openings expose at least part of the seed layer;

filling a conductive material into the openings to form a plurality of conductive patterns, wherein the seed layer and the conductive material comprise a same material;

removing the mask;

removing the seed layer and the barrier layer exposed by the conductive patterns through dry etch to form a plurality of seed layer patterns and a plurality of barrier layer patterns, wherein the conductive patterns, the seed layer patterns, the barrier layer patterns form a plurality of redistribution conductive patterns; and after partially removing the seed layer and the barrier layer, performing a plasma treatment process on the redistribution conductive patterns, wherein the step of removing the seed layer and the barrier layer and the step of performing the plasma treatment process are in-situ processes; and removing the carrier.

15. The method according to claim 14, wherein in the step of removing the seed layer, the etchant comprises Argon (Ar) gas.

16. The method according to claim 15, wherein the etchant further comprises Hydrogen ($H_2$) gas.

17. The method according to claim 14, wherein in the step of removing the barrier layer, an etchant comprises tetrafluoromethane ($CF_4$) gas, fluoroform ($CHF_3$) gas, or a combination thereof.

18. The method according to claim 14, further comprising:

forming a plurality of conductive terminals over the redistribution circuit structure.

19. The method according to claim 14, wherein the seed layer and the conductive material comprise copper.

20. The method according to claim 14, wherein before and after the dry etch, a width difference of each of the conductive patterns is less than 0.1 µm.

* * * * *